(12) United States Patent
Kimura

(10) Patent No.: US 7,071,488 B2
(45) Date of Patent: Jul. 4, 2006

(54) ACTIVE MATRIX DISPLAY DEVICE AND THIN FILM TRANSISTOR DISPLAY DEVICE

(75) Inventor: Mutsumi Kimura, Kyotanabe (JP)

(73) Assignee: Seiko Epson Corporation, Tokyo (JP)

( * ) Notice: Subject to any disclaimer, the term of this patent is extended or adjusted under 35 U.S.C. 154(b) by 52 days.

(21) Appl. No.: 10/765,197

(22) Filed: Jan. 28, 2004

(65) Prior Publication Data

US 2004/0227886 A1    Nov. 18, 2004

(30) Foreign Application Priority Data

Jan. 28, 2003    (JP) .............................. 2003-019128

(51) Int. Cl.
*H01L 29/04*    (2006.01)
*H01L 29/10*    (2006.01)
*H01L 31/036*    (2006.01)
*H01L 31/0376*    (2006.01)
*H01L 31/20*    (2006.01)

(52) U.S. Cl. ............................ 257/59; 257/57; 257/66; 257/72; 257/73; 257/79; 257/81; 257/88; 257/99; 257/100; 257/777; 257/780; 257/781; 257/783; 257/786

(58) Field of Classification Search .................. 257/59, 257/72, 88, 746, 57, 66, 73, 79, 81, 99, 100, 257/777, 780–781, 783, 786
See application file for complete search history.

(56) References Cited

U.S. PATENT DOCUMENTS

| | | | |
|---|---|---|---|
| 5,789,763 A * | 8/1998 | Kato et al. ..................... 257/72 |
| 6,492,659 B1 * | 12/2002 | Yamazaki et al. ............. 257/59 |
| 6,541,294 B1 * | 4/2003 | Yamazaki et al. ............. 438/29 |
| 6,559,916 B1 * | 5/2003 | Urabe et al. ................. 349/113 |
| 6,593,591 B1 * | 7/2003 | Yudasaka et al. .............. 257/57 |
| 6,605,826 B1 * | 8/2003 | Yamazaki et al. ............. 257/72 |
| 6,798,132 B1 * | 9/2004 | Satake .......................... 313/495 |
| 6,849,877 B1 * | 2/2005 | Yamazaki et al. ............. 257/86 |
| 6,911,675 B1 * | 6/2005 | Kato et al. ..................... 257/86 |
| 6,992,439 B1 * | 1/2006 | Yamazaki et al. .......... 313/512 |
| 2001/0040645 A1 * | 11/2001 | Yamazaki ..................... 349/42 |
| 2002/0079493 A1 * | 6/2002 | Morishita ..................... 257/72 |
| 2002/0173085 A1 * | 11/2002 | Nakajima et al. ........... 438/149 |

(Continued)

FOREIGN PATENT DOCUMENTS

JP    A 2001-282423    10/2001

(Continued)

OTHER PUBLICATIONS

Shimoda et al., "Surface Free Technology by Laser Annealing (SUFTLA)" *IEEE*, 1999, pp. 289-292.

(Continued)

*Primary Examiner*—Ida M. Soward
(74) *Attorney, Agent, or Firm*—Oliff & Berridge, PLC

(57) ABSTRACT

The invention provides an active matrix display device in which active elements are formed on a first substrate, wiring lines are formed on a second substrate, an element chip having at least one active element is peeled off from the first substrate and is then transferred onto the second substrate, electro-optical elements are formed on a third substrate, and the second substrate adheres to the third substrate. The invention also provides a method of electrically connecting the active elements of the element chip to the wiring lines of the second substrate and of electrically connecting the active elements of the element chip to the electro-optical elements of the third substrate in a thin film transistor display device in which the active elements are thin film transistors.

6 Claims, 11 Drawing Sheets

U.S. PATENT DOCUMENTS

| | | | |
|---|---|---|---|
| 2003/0011738 A1* | 1/2003 | Akiyama et al. | 349/156 |
| 2003/0011870 A1* | 1/2003 | Otake et al. | 359/315 |
| 2003/0027369 A1* | 2/2003 | Yamazaki | 438/21 |
| 2003/0034497 A1* | 2/2003 | Yamazaki et al. | 257/86 |
| 2003/0092213 A1* | 5/2003 | Yamazaki et al. | 438/48 |
| 2003/0094615 A1* | 5/2003 | Yamazaki et al. | 257/72 |
| 2003/0132446 A1* | 7/2003 | Guenther et al. | 257/88 |
| 2005/0175792 A1* | 8/2005 | Maeda et al. | 428/1.3 |

FOREIGN PATENT DOCUMENTS

| | | |
|---|---|---|
| JP | A 2001-282424 | 10/2001 |
| JP | A 2002-311858 | 10/2002 |
| JP | A 2002-314052 | 10/2002 |
| JP | A 2002-314123 | 10/2002 |
| JP | A 2002-343944 | 11/2002 |
| JP | A 2002-368282 | 12/2002 |
| JP | A 2003-77940 | 3/2003 |
| JP | A 2003-133708 | 5/2003 |
| JP | A 2003-258210 | 9/2003 |

OTHER PUBLICATIONS

Utsunomiya et al., Low Temperature Poly-Si TFTs on Plastic Substrate Using Surface Free Technology by Laser Ablation/Annealing (SUFTLA™), *SID 00 Digest,* 2000, pp. 916-919.

Shimoda, "Future Trend of TFTs", *Asia Display/IDW '01*, pp. 327-330.

Utsunomiya et al., "Low Temperature Poly-Si TFT-LCD Transferred onto Plastic Substrate Using Surface Free Technology by Laser Ablation/Annealing (SUFTLA®)", *Asia Display/IDW '01*, pp. 339-342.

* cited by examiner

US 7,071,488 B2

ACTIVE MATRIX DISPLAY DEVICE AND THIN FILM TRANSISTOR DISPLAY DEVICE

BACKGROUND OF THE INVENTION

1. Field of Invention

The present invention relates to active matrix display devices. More specifically, the invention relates to an active matrix display device in which active elements are formed on a first substrate, wiring lines are formed on a second substrate, electro-optical elements are formed on a third substrate, an element chip having at least one active element is peeled off from the first substrate and is transferred onto the second or third substrate, and the second substrate is attached to the third substrate. Further, the present invention relates to a thin film transistor display device, where the active elements of the active matrix display device are thin film transistors.

2. Description of Related Art

In a related art active matrix display device including active elements, such as thin film transistors, wiring lines between active elements, and a supporting substrate, the active elements can be a part of the display device, and the remaining part of the display device can include the wiring lines and the supporting substrate. When, in the manufacturing process of the active matrix display device, active elements, wiring lines, and a substrate are formed as one body by the same process, a complicated manufacturing process is required in order to make active elements with high performance. Therefore, the manufacturing cost is expensive. However, the wiring lines and the supporting substrate do not require such a complicated and expensive manufacturing process and therefore are manufactured at a low cost. If active elements are manufactured separately from the wiring lines and the supporting substrate and the active elements can be arranged only on the necessary portion, the overall manufacturing cost for the active matrix display device can be reduced.

The related art includes an active matrix display device including: active elements formed on a first substrate, wiring lines formed on a second substrate, and an element chip having at least one active element peeled off from the first substrate and then transferred onto the second substrate. The related art also includes a thin film transistor display device, in which active elements of the active matrix display device are thin film transistors. According to the above-mentioned description, it is possible to arrange active elements only on the necessary portion, thus reducing the overall manufacturing cost of an active matrix display device or a thin film transistor display device. Further, in this case, an adhesive or laser ablation is used in the separating and transferring processes.

FIG. 1 shows a manufacturing method of an active element and an element chip according to the related art. The active element is a thin film transistor. A peeling layer 12 is formed on a first substrate 11, and an underlying insulating film 13 is formed on the peeling layer 12. An amorphous silicon (a-Si) film 14 is formed on the underlying insulating film 13 by PECVD of $SiH_4$, or LPCVD of $Si_2H_6$, and a polysilicon (poly-Si) film is obtained by laser crystallization 15 and is patterned to obtain an active layer 16. A gate insulating film 17 is formed by PECVD or ECR-CVD of TEOS, and a gate metal film is formed thereon and is patterned to obtain a gate electrode 18. P-ions and B-ions are selectively implanted using a resist mask 1a by ion implantation or ion doping 19 to form a source and drain region 1b. A first interlayer insulating film 1c is formed, and then a first contact hole 1d is formed. A source and drain metal film is formed and is patterned to obtain a source and drain electrode 1e. Accordingly, a CMOS thin film transistor including an n-type thin film transistor 1f and a p-type thin film transistor 1g is obtained. Further, a second interlayer insulating film 1h is formed, and then a second contact hole 1i is formed. A pad metal film is formed and is patterned to obtain a connection pad 1j. Finally, separations 1k to separate element chips are formed. Even though only one element chip is shown in FIG. 1, a plurality of element chips is actually arranged.

FIG. 2 shows a method of separating and transferring an element chip according to the related art. As mentioned above, a peeling layer 22 is formed on a first substrate 21, and a thin film transistor 23 and connection pads 24 are formed on the peeling layer 22 to form an element chip 25. Wiring lines 27 and connection pads 28 are formed on a second substrate 26, and an adhesive 29 is applied thereon. Then, the first substrate 21 and the second substrate 26 are press bonded to each other by the adhesive 29 to flow the adhesive and to electrically connect the connection pads 24 of the element chip 25 to the connection pads 28 of the second substrate 26. The adhesive 29 does not flow to adjacent element chips 25, owing to separations 2a. An element chip 25 having at least one thin film transistor 23 is peeled off from the first substrate 21 by laser ablation using an irradiating laser 2b and is then transferred onto the second substrate 26.

FIG. 3 is an enlarged view showing a transferred element chip according to the related art. In FIG. 3, connection pads 33 of an element chip 31 having at least one thin film transistor 32 are electrically connected to connection pads 36 of the second substrate 34 having wiring lines 35 formed thereon (for example, as disclosed in T. Shimoda, et al, Techn. Dig. IEDM 1999, 289, S. Utsunomiya, et al, Dig. Tech. Pap. SID 2000, 916, T. Shimoda, Proc, Asia Display/IDW '01, 327, S. Utsunomiya, et al, Proc. Asia Display/IDW '01, 339).

SUMMARY OF THE INVENTION

An active matrix display device includes active elements formed on a first substrate, wiring lines formed on a second substrate, and an element chip having at least one active element peeled off from the first substrate and then transferred onto the second substrate. A thin film transistor display device includes the active matrix display device, where the active elements are thin film transistors. In these devices, electro-optical elements must be formed. A method is provided of forming electro-optical elements on the third substrate, and of adhering the second substrate to the third substrate.

Accordingly, the present invention provides a method of electrically connecting active elements of the element chip to wiring lines of the second substrate, and of electrically connecting the active elements of the element chip to electro-optical elements of the third substrate in the above-mentioned active matrix display device or the thin film transistor display device.

In order to address or solve the above, the present invention provides an active matrix display device in which active elements are formed on a first substrate, wiring lines are formed on a second substrate, electro-optical elements are formed on a third substrate, an element chip having at least one active element is peeled off from the first substrate and is then transferred onto the second or third substrate, and the second substrate adheres to the third substrate. The active elements are electrically connected to the wiring lines on one surface of the element chip facing the second substrate, and the active elements are electrically connected to the electro-optical elements on the other surface of the element chip facing the third substrate.

According to the above construction, the active elements of the element chip can be electrically connected to the wiring lines of the second substrate, and the active elements of the element chip can be electrically connected to the electro-optical elements of the third substrate.

Further, according to the present invention, the electrical connection in the aforementioned active matrix display device is performed by a conductive material.

According to the above construction, the active elements of the element chip can be electrically connected to the wiring lines of the second substrate, and the active elements of the element chip can be electrically connected to the electro-optical elements of the third substrate.

Further, according to the present invention, in the aforementioned active matrix display device, the conductive material is disposed in a position corresponding to the periphery of the element chip between the element chip and the second or third substrate, and the active elements are electrically connected to the electro-optical elements.

According to the above construction, it is possible to electrically connect the active elements of the element chip to the wiring lines of the second substrate and to electrically connect the active elements of the element chip to the electro-optical elements of the third substrate by using the conductive material only once.

Furthermore, according to the present invention, in the aforementioned active matrix display device, an opening is formed in the element chip, the conductive material is disposed in a position corresponding to the opening between the element chip and the second or third substrate, and the active elements are electrically connected to the electro-optical elements.

According to the above construction, it is possible to electrically connect the active elements of the element chip to the wiring lines of the second substrate and to electrically connect the active elements of the element chip to the electro-optical elements of the third substrate by using the conductive material only once.

Moreover, according to the present invention, the aforementioned active matrix display device is a thin film transistor display device in which active elements are thin film transistors.

According to the above construction, it is possible to obtain a thin film transistor display device having the same effect as the active matrix display device according to the present invention.

DETAILED DESCRIPTION OF PREFERRED EMBODIMENTS

Exemplary embodiments of the present invention are described below. A series of aspects concerning a transcription method is described in Japanese Unexamined Patent Application Publication Nos. 2001-282423 and 2001-282424, which are applied by the applicant.

First Exemplary Embodiment

Figure 1:
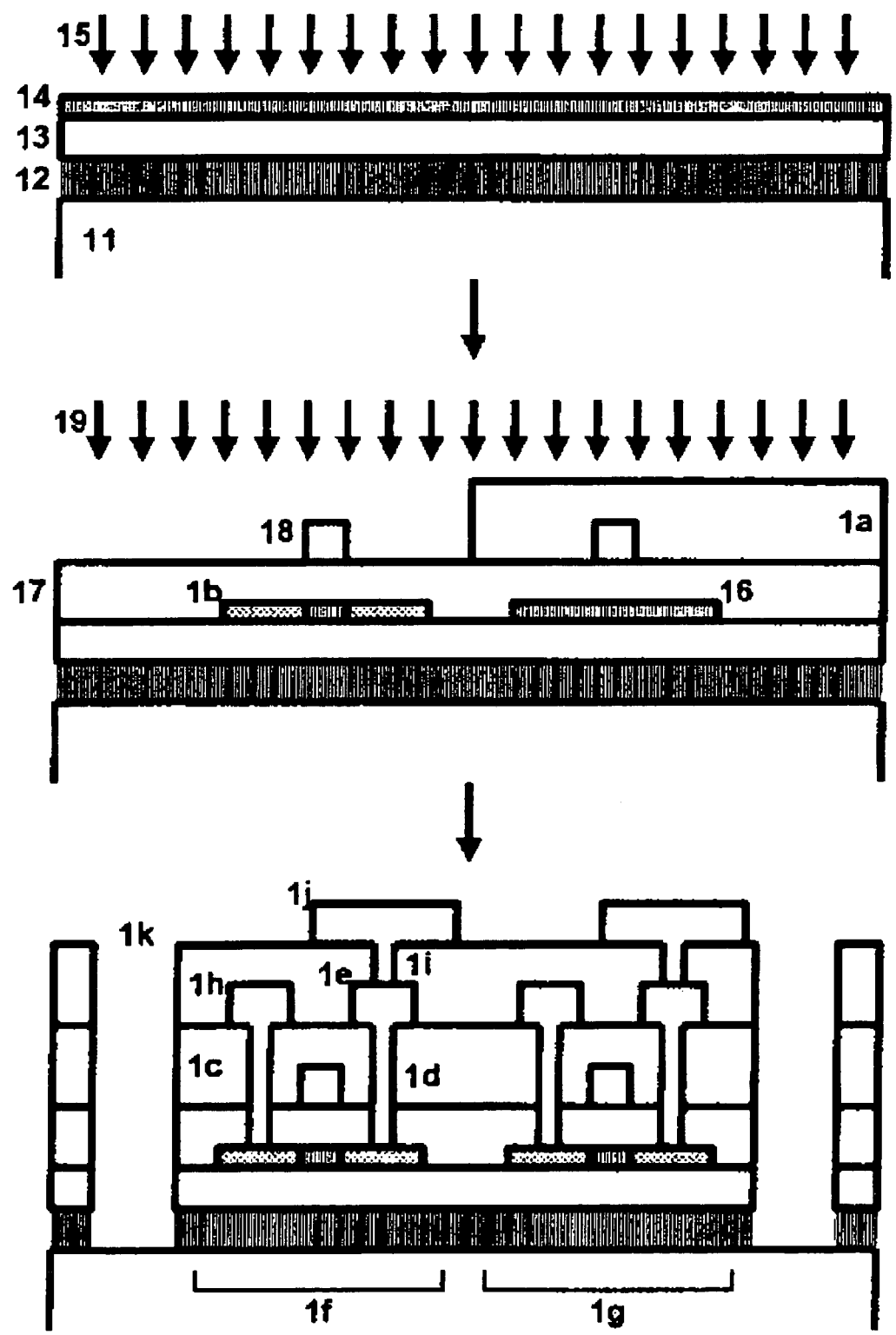
FIG. 1 is a schematic that shows a method of manufacturing an active element and an element chip according to the related art.
Figure 2:
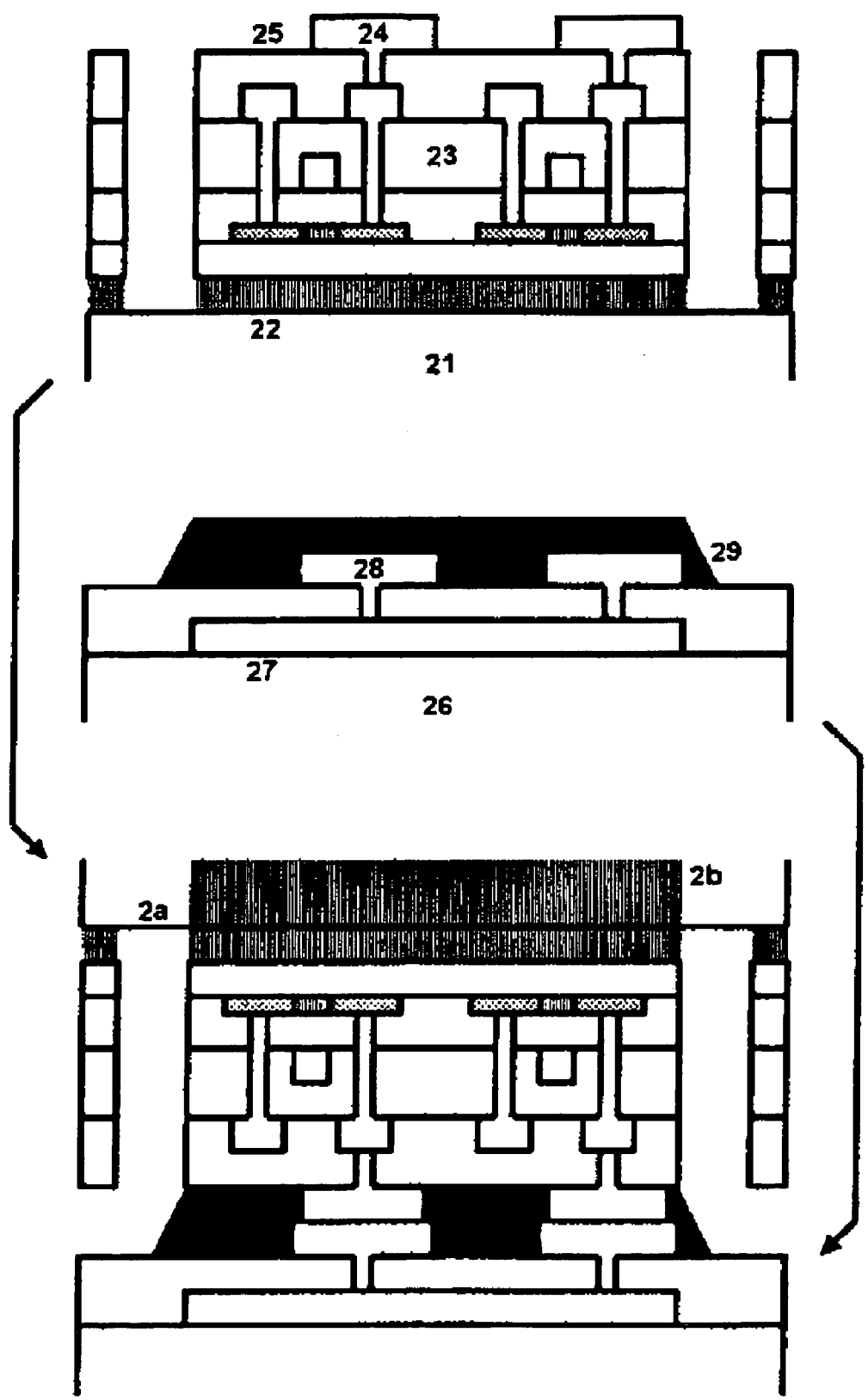
FIG. 2 is a schematic that shows a method of separating and transferring the element chip according to the related art.
Figure 3:
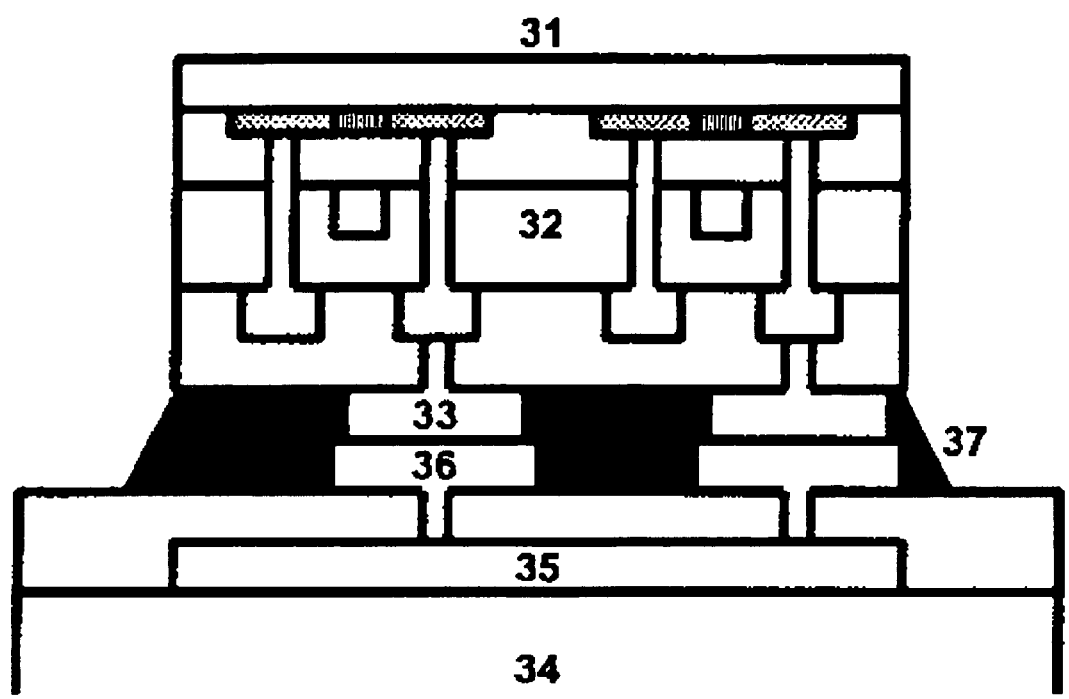
FIG. 3 is an enlarged schematic showing a transferred element chip according to the related art.
Figure 4:
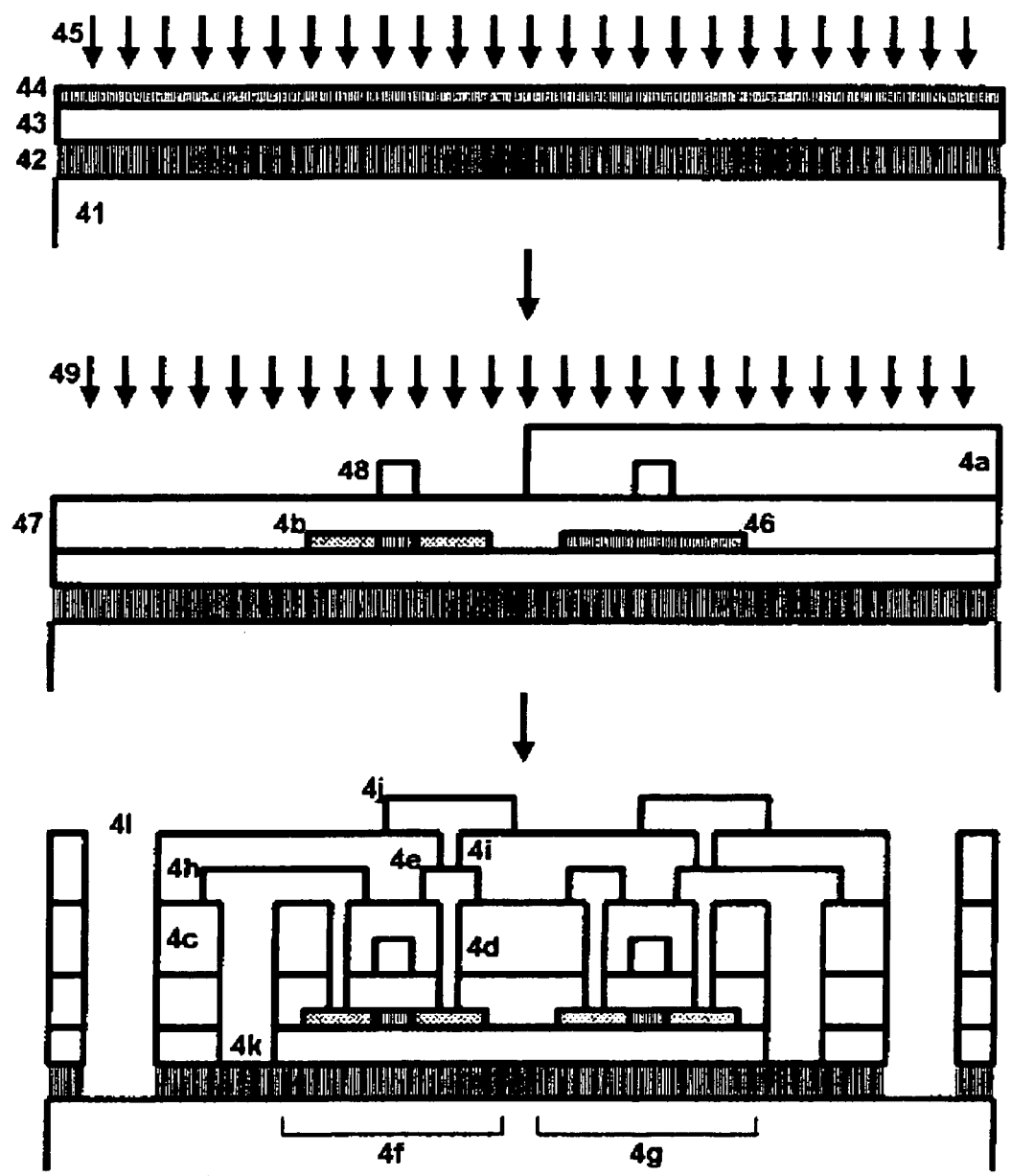
FIG. 4 is a schematic that shows a method of manufacturing an active element and an element chip according to a first exemplary embodiment of the present invention.

FIG. 4 shows a method of manufacturing an active element and an element chip according to a first exemplary embodiment. In the method of manufacturing the active element and the element chip, the first exemplary embodiment is different from the related art in that, when a first contact hole 4d is formed, the hole 4d passes through a underlying insulating film 43 in a portion where an active layer 46 is not formed, and a source and drain metal film is formed. Accordingly, second connection pads 4k are formed on a surface opposite to the first connection pads 4j.

Figure 5:
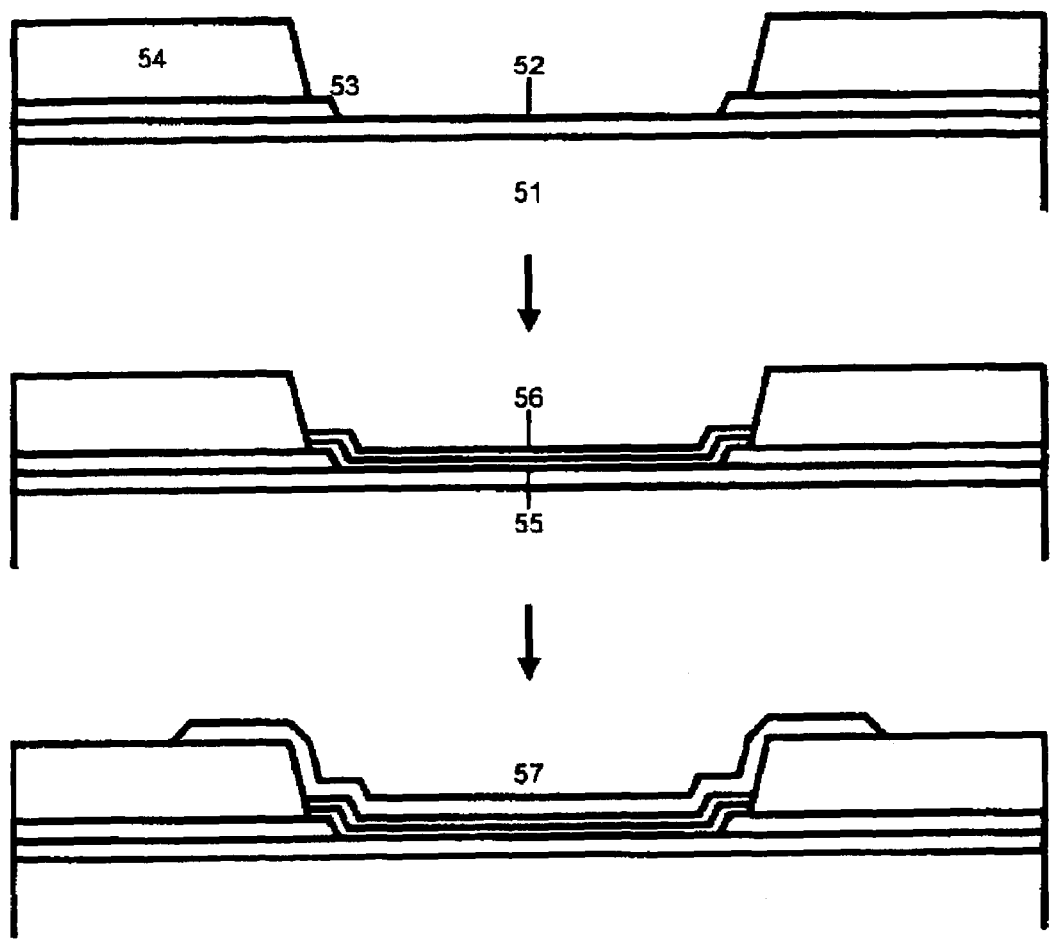
FIG. 5 is a schematic that shows a method of manufacturing an electro-optical element according to the first exemplary embodiment of the present invention.

FIG. 5 shows a method of manufacturing an electro-optical element according to the first exemplary embodiment of the present invention. The electro-optical element is an organic light-emitting diode. An ITO film is formed on a third substrate 51 to obtain an anode 52. A lyophilic material is formed as a film and is then opened to obtain lyophilic banks 53. Then, a lyophobic material is formed as a film and is then opened to obtain lyophobic bank 54. PEDT is selectively applied thereto by an ink-jet method to obtain a hole-carrying layer 55. Then, a light-emitting material is selectively applied thereon to obtain a light-emitting layer 56. A cathode 57 is obtained by depositing a metal having a low work function using a mask.

Figure 6:
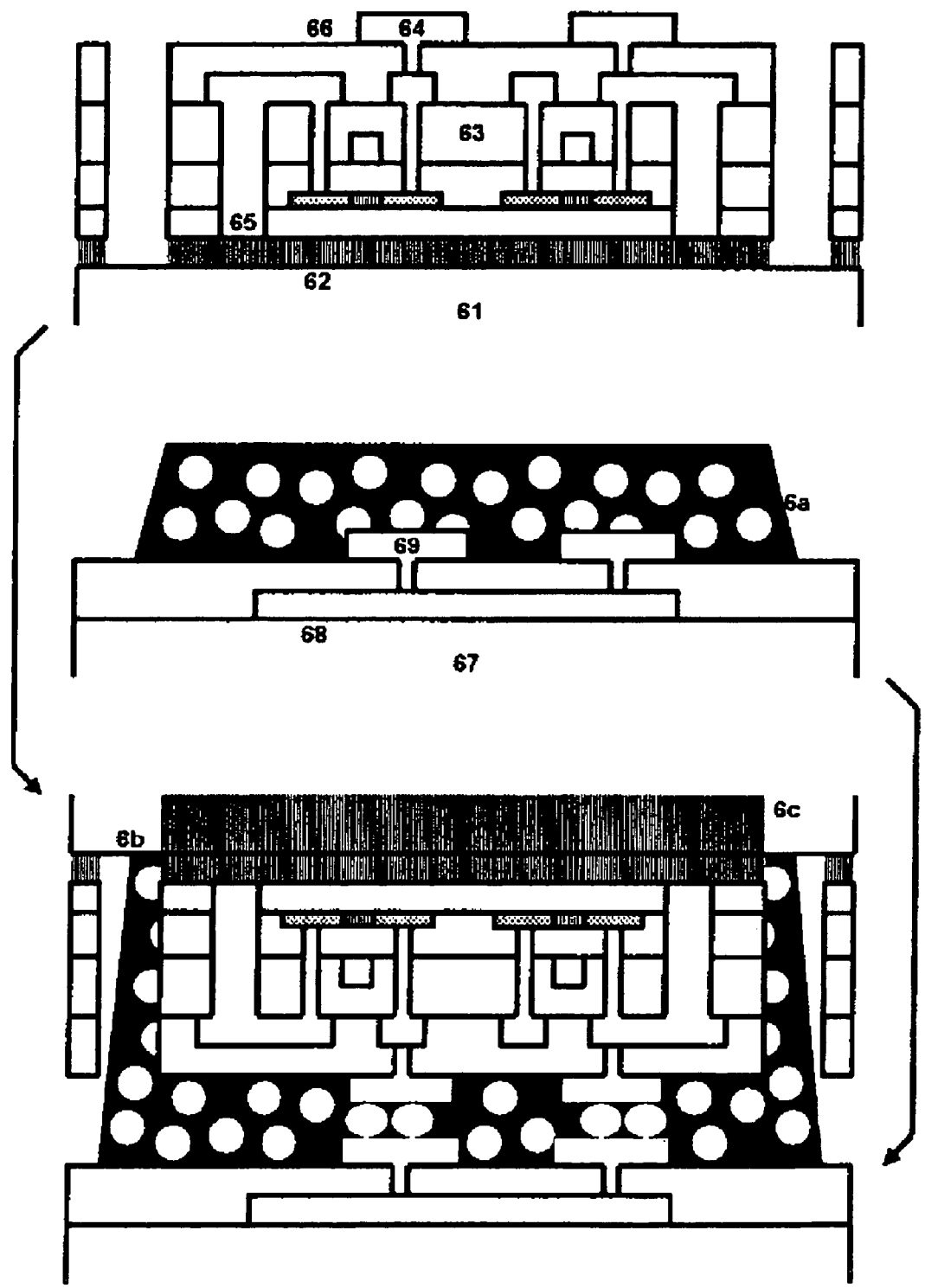
FIG. 6 is a schematic that shows a method of separating and transferring the element chip according to the first exemplary embodiment of the present invention.

FIG. 6 shows a method of separating and transferring an element chip according to the first exemplary embodiment of the present invention. The adhesive is an anisotropic conductive paste. In the method of separating and transferring the element chip, the first exemplary embodiment is different from the related art in that the anisotropic conductive paste 6a is applied over a wider area than the element chip 66 on the second substrate 67, and in that the first substrate 61 and the second substrate 67 are pressed, conductive particles of the anisotropic conductive paste 6a collapse, and first connection pads 64 of the element chip 66 are electrically connected to connection pads 69 of the second substrate 67. Since the anisotropic conductive paste 6a is used, the first connection pads 64 of the element chip 66 are connected to the connection pads 69 of the second substrate 67 opposite the first connection pads 64, but first connection pads 64 of another element chip 66 adjacent to the above-mentioned element chip 64 are not connected to connection pads 69 of the second substrate 67 opposite to the first connection pads 64. Simultaneously, an anisotropic conductive paste 6a in the periphery of the element chip 66 is inserted into separations 6b to reach the first substrate 61. After the element chip 66 is transferred onto the second substrate 67 by an irradiating laser, the second substrate 67 adheres to the third substrate. In this case, when the second substrate 67 and the third substrate are pressed, the anisotropic conductive paste 6a in the separations 6b flows along the surface of the element chip 66 facing the third substrate, and conductive particles in the anisotropic conductive paste 6a collapse to electrically connect the second connection pad 65 of the element chip 66 to the cathode of the third substrate.

Figure 7:
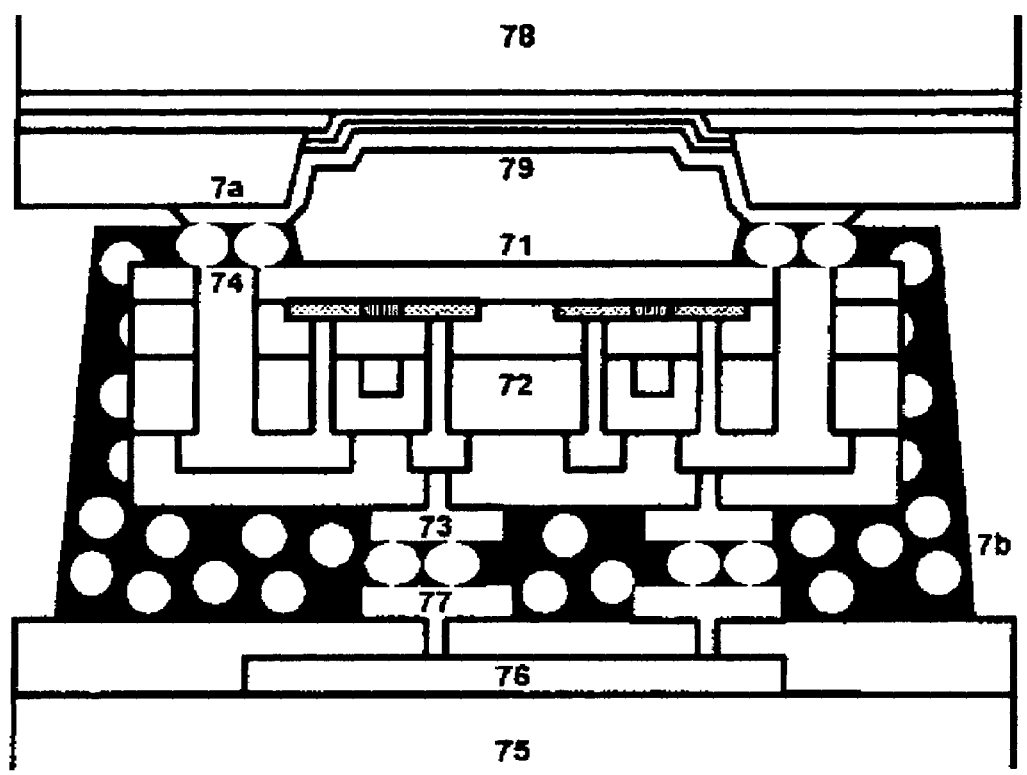
FIG. 7 is an enlarged schematic showing a transferred element chip according to the first exemplary embodiment of the present invention.

FIG. 7 is an exploded view showing a transferred element chip according to the first exemplary embodiment of the present invention. The transferred element chip according to the first exemplary embodiment is different from that of the related art in that first connection pads 73 of an element chip 71 having at least one thin film transistor 72 are electrically connected to connection pads 77 on a second substrate 75 having wiring lines 76 formed thereon by an anisotropic conductive paste 7b, and in that second connection pads 74 of the element chip 71 having at least one thin film transistor 72 are electrically connected to a cathode 7a on a third substrate 78 having an organic light-emitting diode formed thereon in the periphery of the element chip 71 by the anisotropic conductive paste 7b.

In the present exemplary embodiment, the thin film transistor 72, which is an active element, is electrically connected to wiring lines 76 in one surface of the element chip 71 facing the second substrate 75, and the thin film transistor 72, which is an active element, is electrically connected to an organic light-emitting diode 79, which is an electro-optical element, in another surface of the element chip 71 facing the third substrate 78. Further, electrical connection is performed using an anisotropic conductive paste 7b of a conductive material. Moreover, the anisotropic conductive paste 7b of a conductive material is disposed in a position corresponding to the periphery of the element chip 71 between the second substrate 75 and the element chip 71. The thin film transistor 72, which is an active element, is electrically connected to the organic light-emitting diode 79, which is an electro-optical element, by the anisotropic conductive paste 7b.

Further, in the present exemplary embodiment, after the element chip 71 is transferred onto the second substrate 75, the second substrate 75 is bonded to the third substrate 78. However, transferring the element chip 71 onto the third substrate 78, and then adhering the second substrate 75 to the third substrate 78 does not depart from the spirit of the present invention. In addition, even though two first connection pads 73 of the element chip, two connection pads 77 on the second substrate corresponding thereto, and two second connection pads 74 of the element chip are shown in the drawings, any number of elements is effective within the spirit of the present invention.

Second Exemplary Embodiment

Figure 8:
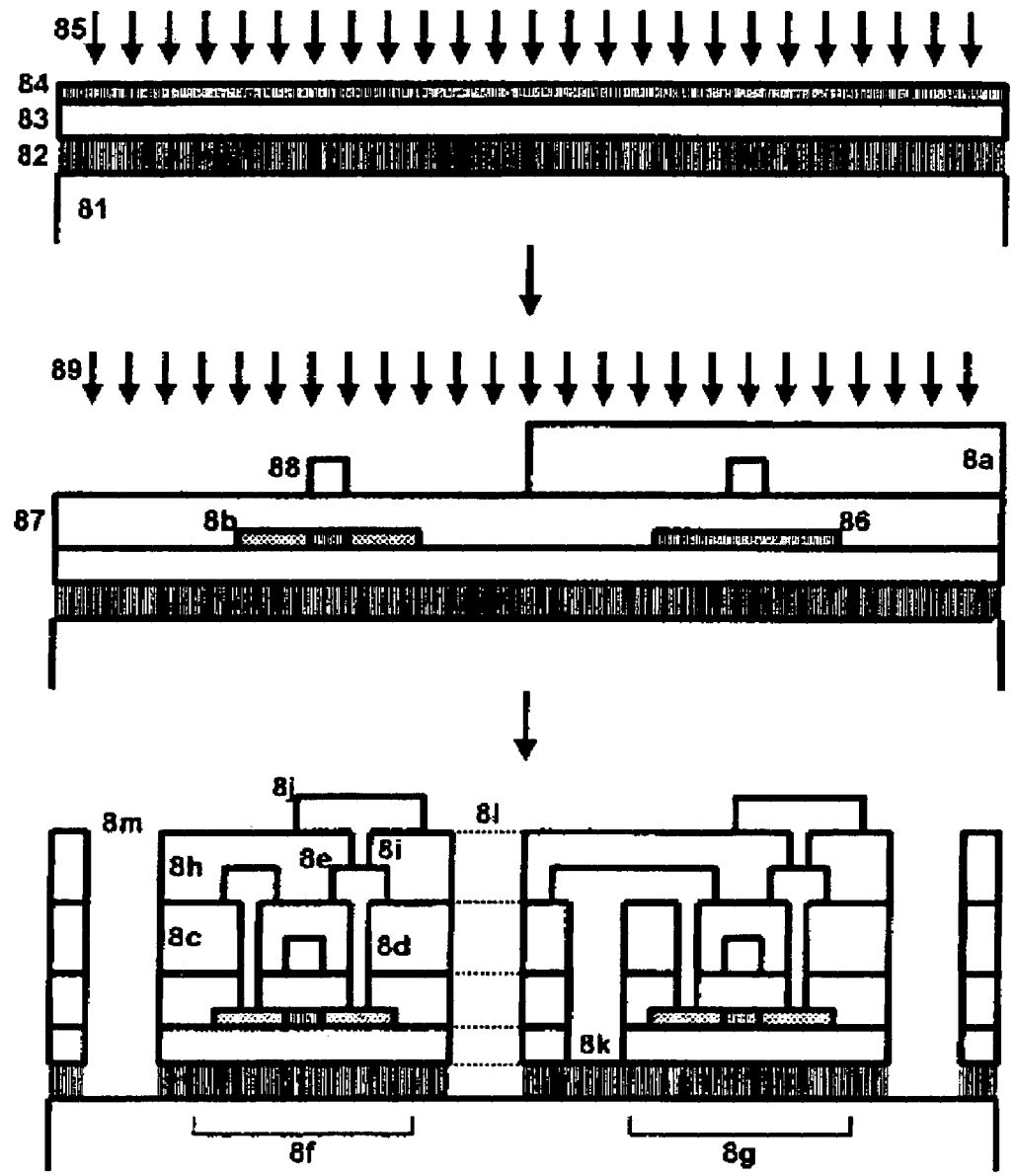
FIG. 8 is a schematic that shows a method of manufacturing an active element and an element chip according to a second exemplary embodiment of the present invention.

FIG. 8 shows a manufacturing method of an active element and an element chip according to a second exemplary embodiment of the present invention. With respect to the method of manufacturing the active element and the element chip, the second exemplary embodiment is different from the first exemplary embodiment in that an opening 81 is simultaneously formed with separations 8m. The opening 81 is a hole of the element chip, and only one element chip is shown in FIG. 8.

Figure 9:
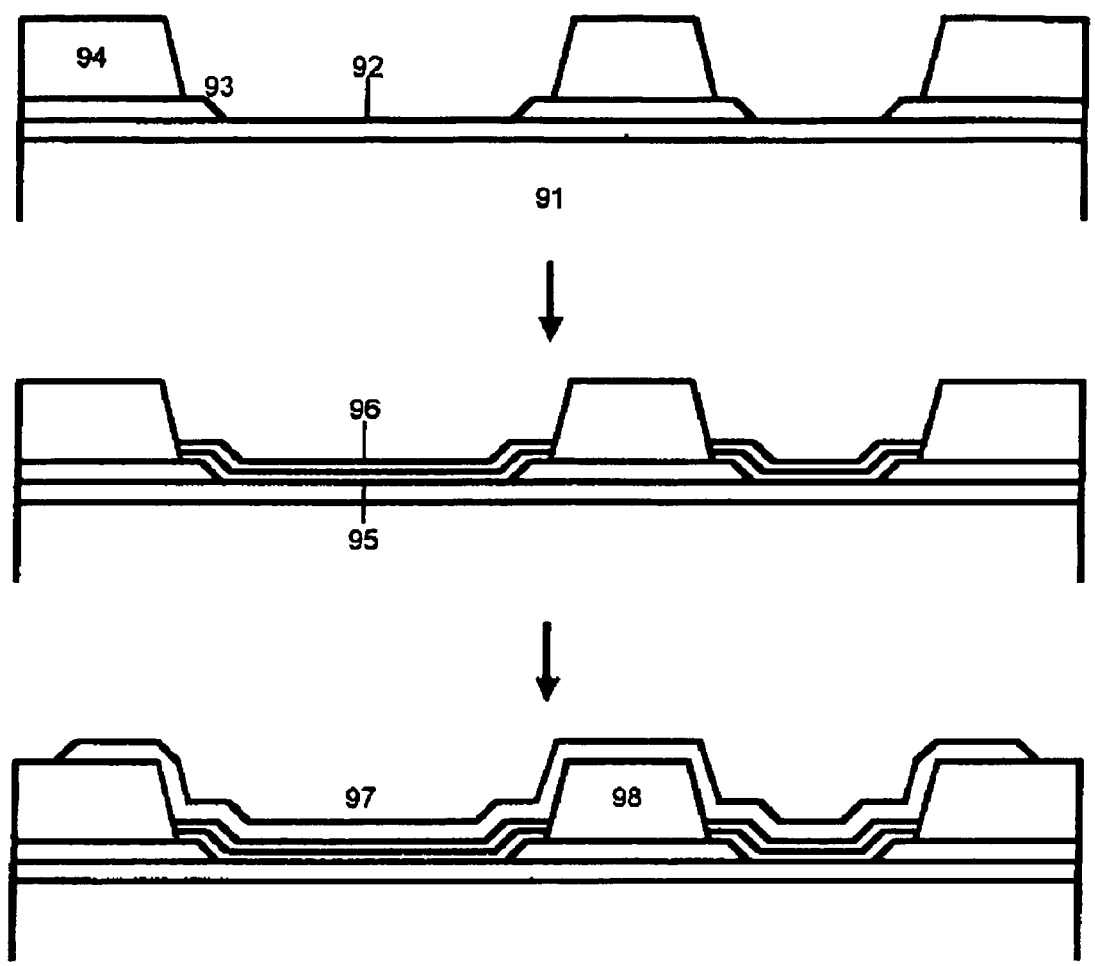
FIG. 9 is a schematic that shows a method of manufacturing an electro-optical element according to the second exemplary embodiment of the present invention.

FIG. 9 shows a method of manufacturing an electro-optical element according to the second exemplary embodiment of the present invention. With respect to the method of manufacturing the electro-optical element, the second exemplary embodiment is different from the first exemplary embodiment in that a connection pad 98 of a third substrate 91 including a lyophilic bank 93, a lyophobic bank 94, and a cathode 97 is formed.

Figure 10:
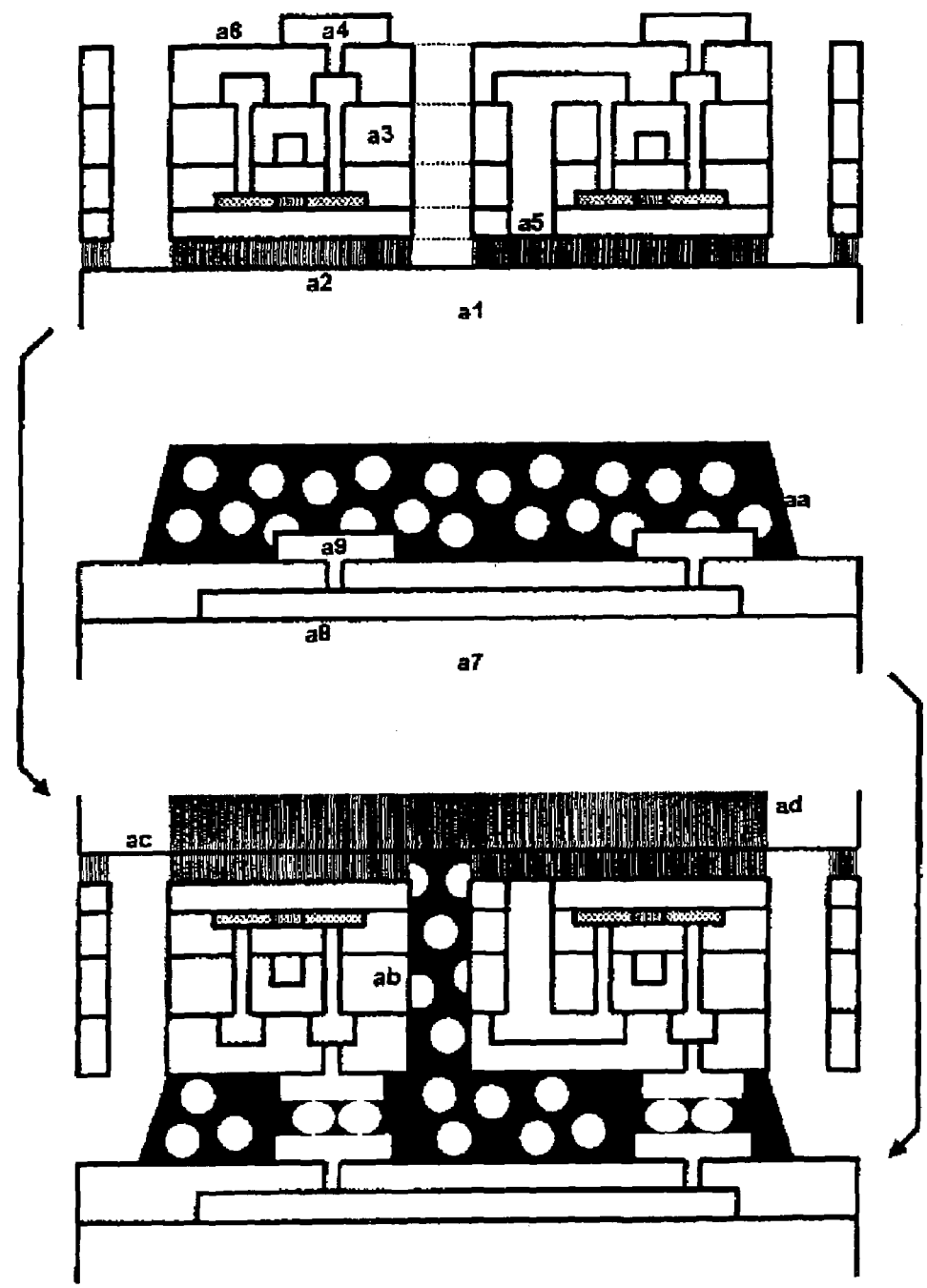
FIG. 10 is a schematic that shows a method of separating and transferring the element chip according to the second exemplary embodiment of the present invention.

FIG. 10 shows a method of separating and transferring an element chip according to the second exemplary embodiment of the present invention. With respect to the method of separating and transferring the element chip, the second exemplary embodiment is different from the first exemplary embodiment in that an anisotropic conductive paste aa is inserted into an opening ab of the element chip a6 to reach a first substrate a1. After the element chip a6 is transferred onto a second substrate a7 by an irradiating laser ad, the second substrate a7 adheres to a third substrate. In this case, when the second substrate a7 and the third substrate are pressed, the anisotropic conductive paste aa in the opening ab flows along the surface of the element chip a6 facing the third substrate, and conductive particles in the anisotropic conductive paste aa collapse to electrically connect a second connection pad a5 of the element chip a6 to a connection pad of the third substrate.

Figure 11:
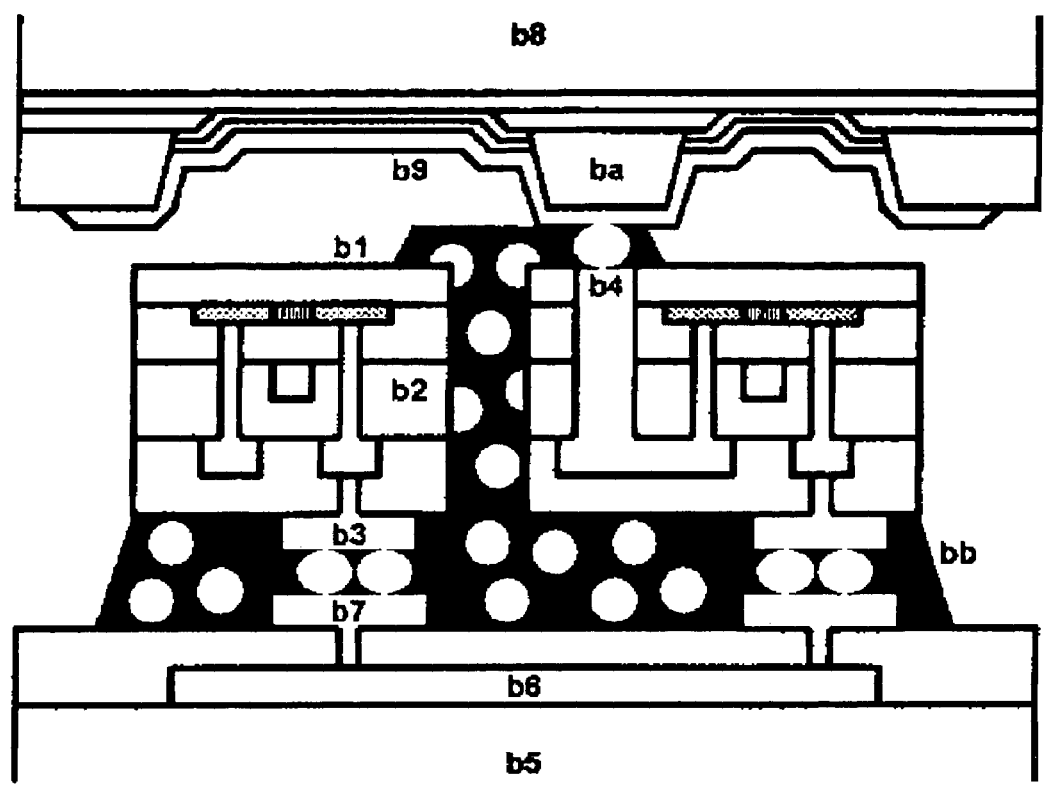
FIG. 11 is an enlarged schematic of a transferred element chip according to the second exemplary embodiment of the present invention.

FIG. 11 is an enlarged view of a transferred element chip according to the second exemplary embodiment of the present invention. The transferred element chip according to the second exemplary embodiment is different from that of the first exemplary embodiment in that a second connection pad b4 of an element chip b1 having at least one thin film transistor b2 is electrically connected to a connection pad ba on a third substrate b8 having an organic light-emitting diode b9 formed thereon by an anisotropic conductive paste bb inserted in the opening of element chip b1.

In the present exemplary embodiment, the thin film transistor b2, which is an active element, is electrically connected to wiring lines b6 on one surface of the element chip b1 facing the second substrate b5, and the thin film transistor b2, which is an active element, is electrically connected to an organic light-emitting diode b9, which is an electro-optical element, on another surface of the element chip b1 facing the third substrate b8. Further, the electrical connection is performed using an anisotropic conductive paste bb of a conductive material. Moreover, an opening is formed in the element chip b1, and the anisotropic conductive paste bb of a conductive material is disposed in the position corresponding to the opening between the second substrate b5 and the element chip b1. Then, the thin film transistor b2, which is an active element, is electrically connected to the organic light-emitting diode b9 which is an electro-optical element.

Further, in the present exemplary embodiment, after the element chip b1 is transferred onto the second substrate b5, the second substrate b5 adheres to the third substrate b8.

However, transferring the element chip b1 onto the third substrate b8, and then adhering the second substrate b5 to the third substrate b8 does not depart from the spirit of this invention. In addition, even though two first connection pads b3 of the element chip and two connection pads b7 on the second substrate corresponding thereto, and one second connection pad b4 of the element chip and one connection pad ba on the third substrate corresponding thereto are shown in FIG. 11, any number of elements is available within the spirit of the present invention.

Further, the present invention can be applied to liquid crystal electro-optical devices using an active matrix substrate. The active matrix substrate applied to the present invention according to the aforementioned exemplary embodiments can reduce manufacturing costs and can enhance the quality as compared with an electro-optical device using a related active matrix substrate. Although a liquid crystal electro-optical device is used as an electro-optical device, other electro-optical devices, such as an organic light-emitting device and an electrophoresis display device, can be applied.

The above electro-optical devices are mounted to electronic apparatuses, such as mobile telephones, and thus the present invention can provide an electronic apparatus having the above advantage.

What is claimed is:

1. An active matrix display device comprising:
 a first substrate including an organic light-emitting element, in which a light-emitting layer is formed between an anode and a cathode, and
 a second substrate including a thin film transistor electrically connected to the organic light-emitting element, the first substrate being bonded to the second substrate, by using anisotropic conductive paste disposed in a position corresponding to the periphery of the thin film transistor,
 the organic light-emitting element being located immediately above the thin film transistor.

2. The active matrix display device according to claim 1, further comprising a wiring line on the second substrate, wherein the wiring line is connected to the thin film transistor by the anisotropic conductive paste disposed in a position corresponding to the periphery of the thin film transistor.

3. An active matrix device, comprising:
 a first substrate including an electro-optical element; and
 a second substrate including a thin film transistor electrically connected to the electro-optical element, the first substrate being bonded to the second substrate, by using conductive material disposed in a position corresponding to the periphery of the thin film transistor,
 the electro-optical element being located in a position corresponding to the thin film transistor.

4. The active matrix device according to claim 3, wherein the electro-optical element is an organic light-emitting element, in which a light-emitting layer is formed between an anode and a cathode.

5. The active matrix device according to claim 3, wherein the conductive material is an anisotropic conductive paste.

6. The active matrix device according to claim 3, further comprising a wiring line on the second substrate, wherein the wiring line is connected to the thin film transistor by the conductive material disposed in a position corresponding to the periphery of the thin film transistor.

* * * * *